(12) United States Patent
Su

(10) Patent No.: US 10,194,528 B2
(45) Date of Patent: Jan. 29, 2019

(54) COMPOSITE MATERIAL, HIGH-FREQUENCY CIRCUIT BASEBOARD MADE THEREFROM AND PRODUCTION METHOD THEREOF

(75) Inventor: Minshe Su, Guangdong (CN)

(73) Assignee: GUANGDONG SHENGYI SCI. TECH CO., LTD., Guangdong (CN)

( * ) Notice: Subject to any disclaimer, the term of this patent is extended or adjusted under 35 U.S.C. 154(b) by 266 days.

(21) Appl. No.: 14/115,748

(22) PCT Filed: Sep. 14, 2011

(86) PCT No.: PCT/CN2011/079650
§ 371 (c)(1),
(2), (4) Date: Nov. 5, 2013

(87) PCT Pub. No.: WO2012/151820
PCT Pub. Date: Nov. 15, 2012

(65) Prior Publication Data
US 2014/0057094 A1    Feb. 27, 2014

(30) Foreign Application Priority Data

May 6, 2011   (CN) .......................... 2011 1 0117172

(51) Int. Cl.
| C08J 5/24 | (2006.01) |
| H05K 1/03 | (2006.01) |
| B32B 27/04 | (2006.01) |
| C08J 5/18 | (2006.01) |
| C08J 9/42 | (2006.01) |
| H05K 1/02 | (2006.01) |

(52) U.S. Cl.
CPC .......... *H05K 1/0373* (2013.01); *B32B 27/04* (2013.01); *C08J 5/18* (2013.01); *C08J 9/42* (2013.01); *H05K 1/036* (2013.01); *C08J 2201/038* (2013.01); *C08J 2327/18* (2013.01); *C08J 2427/18* (2013.01); *H05K 1/024* (2013.01); *H05K 1/0366* (2013.01); *H05K 2201/015* (2013.01); *H05K 2201/0116* (2013.01); *H05K 2201/0209* (2013.01); *Y10T 428/249955* (2015.04); *Y10T 428/249958* (2015.04); *Y10T 428/3154* (2015.04)

(58) Field of Classification Search
None
See application file for complete search history.

(56) References Cited

U.S. PATENT DOCUMENTS

| 4,111,866 A | * | 9/1978 | Torikai ..................... C25B 13/04 204/296 |
| 4,210,697 A | * | 7/1980 | Adiletta .............. D06M 15/256 162/152 |
| 4,716,074 A | * | 12/1987 | Hurley ................. B01D 39/163 264/127 |
| 4,772,509 A | | 9/1988 | Komada et al. |
| 4,847,146 A | * | 7/1989 | Yeh .......................... B32B 7/02 428/332 |
| 4,857,381 A | * | 8/1989 | Suzuki .................... B29C 70/00 428/120 |
| 4,911,771 A | * | 3/1990 | Tanaka .................... B32B 15/08 156/60 |
| 4,996,097 A | * | 2/1991 | Fischer ................... B32B 15/08 428/220 |
| 5,264,276 A | * | 11/1993 | McGregor ............... A62D 5/00 156/306.6 |
| 5,473,118 A | * | 12/1995 | Fukutake ............... H05K 3/281 174/250 |
| 5,538,756 A | | 7/1996 | Korleski et al. |
| 5,576,517 A | * | 11/1996 | Wojnarowski ........ H01L 21/481 174/258 |
| 5,652,055 A | | 7/1997 | King et al. |
| 5,753,358 A | * | 5/1998 | Korleski .............. H05K 1/0353 428/308.4 |
| 5,847,327 A | * | 12/1998 | Fischer ............. H01L 23/49827 174/258 |
| 5,879,794 A | * | 3/1999 | Korleski, Jr. ............. B32B 5/28 428/317.1 |
| 5,977,241 A | * | 11/1999 | Koloski ................ C08F 283/00 428/319.1 |
| 6,121,171 A | * | 9/2000 | Takahashi .................. C08J 5/04 428/308.4 |

(Continued)

FOREIGN PATENT DOCUMENTS

| CN | 85102225 A | 9/1986 |
| CN | 1203610 A | 12/1998 |

(Continued)

OTHER PUBLICATIONS

NPL on Dispersants, Nature, May 12, 2010, retrieved on Mar. 11, 2016 from http://www.nature.com/news/2010/100512/full/news.2010.237.html.*

(Continued)

*Primary Examiner* — Z. Jim Yang
(74) *Attorney, Agent, or Firm* — James R. Crawford; Norton Rose Fulbright US LLP

(57) ABSTRACT

A composite material, a high-frequency circuit baseboard made therefrom and a production method thereof. The composite material comprises: a dispersed emulsion of fluoropolymer with a low dielectric loss; a porous, expanded polytetrafluoroethylene film; and a powdery packing. The high-frequency circuit baseboard made from the composite material comprises: several laminated sheets of prepreg made from the composite material, and copper foils pressed over the two properties sides thereof. The baseboard uses a porous ePTFE film with excellent dielectric as a carrier material, which can lower the dielectric constant and dielectric loss angle tangent of the composite material and high-frequency circuit baseboard. The dielectric constant of the high-frequency circuit baseboard and prepreg is isotropic in both X and Y directions. The thickness of the prepreg can be regulated by employing porous ePTFE films with a different thickness, which avoids cracking.

8 Claims, No Drawings

(56) References Cited

U.S. PATENT DOCUMENTS

| | | | | |
|---|---|---|---|---|
| 6,143,401 | A * | 11/2000 | Fischer | H01L 21/4857 174/255 |
| 6,218,000 | B1 | 4/2001 | Rudolf et al. | |
| 6,218,015 | B1 | 4/2001 | Allen et al. | |
| RE37,701 | E * | 5/2002 | Bahar | B01D 67/0088 204/296 |
| 6,498,207 | B1 * | 12/2002 | Hoshikawa | C08L 27/18 524/198 |
| 6,783,841 | B2 | 8/2004 | McCarthy et al. | |
| 7,145,221 | B2 | 12/2006 | Memis et al. | |
| 7,923,053 | B2 | 4/2011 | Kitching et al. | |
| 8,029,562 | B2 | 10/2011 | Kitching et al. | |
| 8,985,818 | B2 * | 3/2015 | Kitagawa | H05K 1/0373 362/382 |
| 2001/0005548 | A1 * | 6/2001 | Farquhar | H05K 1/036 428/325 |
| 2001/0018096 | A1 * | 8/2001 | Klare | B01D 67/0088 427/385.5 |
| 2002/0037397 | A1 * | 3/2002 | Suzuki | H05K 1/024 428/209 |
| 2003/0082363 | A1 * | 5/2003 | Nakagiri | B32B 5/26 428/313.3 |
| 2003/0203174 | A1 | 10/2003 | McCarthy et al. | |
| 2003/0211264 | A1 * | 11/2003 | Farnsworth | B32B 5/18 428/36.9 |
| 2004/0022012 | A1 * | 2/2004 | Yamamoto | B32B 5/28 361/600 |
| 2005/0150833 | A1 * | 7/2005 | Funaki | C08F 14/18 210/643 |
| 2005/0224251 | A1 | 10/2005 | Memis et al. | |
| 2005/0238813 | A1 * | 10/2005 | Sanguineti | B01D 67/0093 427/430.1 |
| 2006/0018777 | A1 * | 1/2006 | Zumbrum | F04B 43/0054 417/476 |
| 2006/0214325 | A1 * | 9/2006 | O'Brien | B01D 67/0009 264/172.19 |
| 2008/0009211 | A1 * | 1/2008 | Himes | B32B 27/08 442/181 |
| 2008/0234811 | A1 | 9/2008 | Kitching et al. | |
| 2008/0281067 | A1 * | 11/2008 | Nanba | C08F 14/26 526/255 |
| 2010/0015404 | A1 * | 1/2010 | Paul | H05K 1/0373 428/172 |
| 2010/0159223 | A1 * | 6/2010 | Keese | C09D 127/18 428/219 |
| 2010/0272941 | A1 * | 10/2010 | Cherukupalli | B01D 67/002 428/41.3 |
| 2011/0137263 | A1 * | 6/2011 | Ashmead | A61M 5/31513 604/230 |
| 2011/0209812 | A1 * | 9/2011 | Bansal | B29C 70/44 156/87 |
| 2011/0268961 | A1 * | 11/2011 | Manabe | B01D 39/1692 428/319.3 |
| 2011/0287334 | A1 * | 11/2011 | Tanaka | H01M 4/8626 429/480 |
| 2012/0024581 | A1 * | 2/2012 | Hasegawa | H01B 3/445 174/258 |
| 2015/0015120 | A1 * | 1/2015 | Kaimori | H01L 41/45 310/363 |

FOREIGN PATENT DOCUMENTS

| | | | | |
|---|---|---|---|---|
| CN | 101039546 A | | 9/2007 | |
| CN | 101973145 A | | 2/2011 | |
| EP | 0 248 617 A2 | | 12/1987 | |
| EP | 0360415 A1 | * | 3/1990 | H01P 3/16 |
| GB | 2 195 269 A | | 4/1988 | |
| GB | 2195269 A | * | 4/1988 | C08J 9/42 |
| GB | 2262101 A | * | 6/1993 | C08L 27/18 |
| JP | 54141156 A | * | 11/1979 | C08L 27/18 |
| WO | 97/39484 A1 | | 10/1997 | |
| WO | WO-9739484 A1 | * | 10/1997 | H01L 21/312 |

OTHER PUBLICATIONS

Definition of the term Prepreg from FibreGlast, retrieved on Feb. 1, 2017 from www.fibreglast.com/category/prepreg_fabrics.*

* cited by examiner

COMPOSITE MATERIAL, HIGH-FREQUENCY CIRCUIT BASEBOARD MADE THEREFROM AND PRODUCTION METHOD THEREOF

This application is a § 371 of International Application No. PCT/CN2011/079650 filed Sep. 14, 2011, and claims priority from Chinese Patent Application No. 201110117172.3 filed May 6, 2011.

TECHNICAL FIELD

The present invention relates to field of composite materials, especially a composite material, a high-frequency circuit baseboard made therefrom and production method thereof.

BACKGROUND ART

Recently, along with high performance, high function and network development of information and communication apparatus, operation signals tend to high frequency for high-speed transmission and processing of large capacity of information. The rise of the use frequency of electronic products requests a lower dielectric constant of the baseboard material, a less dielectric loss and a better homogeneity of the dielectric constant of the baseboard.

Resins with a low dielectric constant are used in the high-frequency circuit baseboard at present to obtain a better high-frequency performance. These resins include polyphenylether, cyanate, thermosetting resins consisting of elemental carbon and hydrogen and comprising carbon-carbon unsaturated double bonds, PTFE and the like. As for the copper-clad plate, glass-fiber cloth is generally used as the reinforcing material. However, the lowest dielectric constant of glass-fiber cloth is only 3.7 (Q-glass). Due to a great dielectric constant of glass-fiber cloth, it is difficult to lower the dielectric constant of the copper-clad plate made from other resins than PTFE.

On the other side, woven materials are used as the reinforcing materials in the current high-frequency circuit baseboard (e.g. glass fiber cloth). Due to weaving and the presence of nodes of the crossing parts of the woven fibers, the dielectric constant in the circuit board is not isotropic in the planar X and Y directions, and there is the dielectric constant difference in the X and Y directions. During the transmission of such high-frequency signals in the high-frequency circuit baseboard, different dielectric constants in the X and Y directions will result in signal attenuation so as to affect the signal transmission stability.

U.S. Pat. No. 6,218,015 discloses combining two polytetrafluoroethylene resins, mixing, filling and casting into films to produce a circuit baseboard. Due to the use of thermoplastic polytetrafluoroethylene resin, the circuit material produced by such method has excellent dielectric properties, and there is no difference in the dielectric constants in the X and Y directions. However, cracks readily occur and the rate of finished products is not high when such casting method is used to produce thicker films. Especially when circuit boards having a greater thickness are required, many layers of films need to be laminated, thereby resulting in a low production efficiency.

U.S. Pat. No. 4,772,509 discloses impregnating polyimides with a porous, expanded polytetrafluoroethylene film to produce a prepreg, then to produce a circuit baseboard. U.S. Pat. No. 5,652,055 discloses impregnating a thermosetting resin with a porous, expanded polytetrafluoroethylene film to produce a circuit baseboard. However, since these two patents disclose producing a circuit baseboard with the thermosetting resins having a great dielectric loss angle tangent (which is greater than 0.01), their dielectric properties are worse than the circuit baseboards produced by using polytetrafluoroethylene resin in U.S. Pat. No. 6,218,015.

CONTENTS OF THE INVENTION

The object of the present invention lies in providing a composite material, using a porous ePTFE film with excellent dielectric properties as a carrier material, providing a prepreg and isotropy of the dielectric constant of the high-frequency circuit baseboard in both X and Y directions, which can lower the dielectric constant and dielectric loss angle tangent of the high-frequency circuit baseboard.

Another object of the present invention lies in providing a high-frequency circuit baseboard produced by said composition material, having isotropy of the dielectric constant in both X and Y directions and high-frequency dielectric properties and having better signal transmission effect in high-frequency circuit.

Another object of the present invention lies in providing a process for producing a high-frequency circuit baseboard made from said composition material, comprising using a porous ePTFE film as a carrier material, which has a better compactibility, no cracks and simple technological operations.

In order to achieve said object, the present invention provides a composite material, comprising (1) a dispersed emulsion of fluoropolymer with a low dielectric loss; (2) a porous, expanded polytetrafluoroethylene film; and (3) a powdery filler.

The fluoropolymer with a low dielectric loss is one or more selected from the group consisting of polytetrafluoroethylene (PTFE), tetrafluoroethylene-perfluoroalkoxyethylene ether copolymer (PFA), and perfluoroethylenepropylene copolymer (FEP).

The porous, expanded polytetrafluoroethylene film is made from polytetrafluoroethylene resin without or with ceramic fillers.

The porous, expanded polytetrafluoroethylene film is made by the expansion-stretching method, and has a pore size of from 1 to 100 μm, a porosity of 30-98% and a thickness of from 0.5 to 300 μm.

The powdery filler is in an amount of from 0 to 70 vol. % of the total amount of the dispersed emulsion of fluoropolymer with a low dielectric loss and the powdery filler, and has a particle size of up to 100 μm and a median value of the particle size of from 0.01 to 15 μm.

The powdery filler is one or more selected from the group consisting of crystalline silicon dioxide, fused silicon dioxide, spherical silicon dioxide, alumina, strontium titanate, barium titanate, barium strontium titanate, boron nitride, aluminium nitride, silicon nitride, titania, glass powder, glass chopped fiber, talc, mica powder, carbon black, carbon nanotube, metal powder and polyphenylene sulfide.

There further comprises (4) an auxiliary agent, comprising an emulsifying agent and a dispersant.

The present invention further provides a high-frequency circuit baseboard comprising several laminated sheets of prepreg made from the composite material, and metal foils pressed over the two sides thereof, wherein said metal foils are copper, brass, aluminium, nickel, alloy or composite metal foils thereof.

Meanwhile, the present invention provides a process for making a high-frequency circuit baseboard, comprising step 1: weighing the components of the composite material comprising (1) a dispersed emulsion of fluoropolymer with a low dielectric loss; (2) a porous, expanded polytetrafluoroethylene film; and (3) a powdery filler;

step 2: diluting the dispersed emulsion of fluoropolymer with a low dielectric loss with water to a suitable viscosity, adjusting the pH to 8-12 with ammonia water, mixing the powdery filler with the auxiliary agent, adding to the dispersed emulsion adjusted above, stirring and mixing to homogeneously disperse the powdery filler therein to obtain a liquid cement;

step 3: impregnating the porous, expanded polytetrafluoroethylene film with said liquid cement, controlling to a suitable thickness, baking at a temperature of 80-300° C. to remove water and the auxiliary agent to form a prepreg; and step 4: laminating said several sheets of prepreg, pressing a metal foil over each of the two sides thereof, hot-pressing in a hot press at a temperature of 350-400° C. and a pressure of 25-100 Kg/cm$^2$ to obtain a high-frequency circuit baseboard.

The liquid cement has a solid content of 30-80%; said liquid cement forms a fluoropolymer resin layer on the surface of the porous, expanded polytetrafluoroethylene film, having a thickness to be controlled below 20 microns.

The present invention has the following beneficial effects. Firstly, a porous ePTFE film having excellent dielectric properties is used as a carrier material, which can lower the dielectric constant and dielectric loss angle tangent of the composite material and high-frequency circuit baseboard.

Secondly, due to good flatness and uniformity of the porous ePTFE film, the dielectric constant of the high-frequency baseboard and prepreg made by using the film as the carrier material is isotropic in both X and Y directions.

Furthermore, the thickness of the prepreg can be regulated according to the thickness of porous ePTFE films with difference thicknesses, which avoids the cracking problem caused by using a thick film produced by casting in the prior art (e.g. U.S. Pat. No. 6,218,015).

EMBODIMENTS

The present invention provides a composite material, comprising (1) a dispersed emulsion of fluoropolymer with a low dielectric loss; (2) a porous, expanded polytetrafluoroethylene film; and (3) a powdery filler.

Examples of the dispersed emulsion of fluoropolymer with a low dielectric loss of the present invention comprise polytetrafluoroethylene (PTFE), fluorine-containing polymers and the like, e.g. a dispersed emulsion of polytetrafluoroethylene (PTFE), a dispersed emulsion of tetrafluoroethylene-perfluoroalkoxyethylene ether copolymer (PFA), and a dispersed emulsion of perfluoroethylenepropylene copolymer (FEP). Said dispersed emulsion may be used separately or in combination. The dispersed emulsion of the present invention uses water as the medium, wherein from 25 to 60% of fluoropolymer particles are dispersed in water and made at a stably dispersed state by using non-ionic surfactant, to form an emulsion. The fluoropolymer particles in the dispersed emulsion have a particle size of from 0.02 to 0.5 microns for convenience of the subsequent impregnation.

The porous ePTFE film of the present invention is made by the expansion-stretching method. There are a plurality of opening-pores, and the pore size is great enough for the entry of resins and fillers. According to the present invention, the porous ePTFE film of the present invention has a pore size of from 1 to 100 μm, preferably from 3 to 50 μm, a porosity of 30-98%, preferably 50-98%, and a thickness of from 0.5 to 300 μm, preferably from 30 to 300 μm. During the impregnation, the presence of a plurality of pores inside the ePTFE film is convenient for the entry of the dispersed emulsion and powdery filler.

The porous ePTFE film of the present invention may be made from pure PTFE resin (polytetrafluoroethylene resin), or from PTFE resin into which the ceramic filler is added. According to the present invention, the surface of said porous ePTFE film is processed, preferably by plasma.

The powdery filler may be added to the composite material of the present invention, and the powdery filler has the function of improving the size stability and reducing the CTE. The powdery filler is in an amount of from 0 to 70 vol. %, preferably from 30 to 55 vol. % of the total amount of the dispersed emulsion of fluoropolymer with a low dielectric loss and the powdery filler. The powdery filler is one or more selected from the group consisting of crystalline silicon dioxide, fused silicon dioxide, spherical silicon dioxide, alumina, strontium titanate, barium titanate, barium strontium titanate, boron nitride, aluminium nitride, silicon nitride, titania, glass powder, glass chopped fiber, talc, mica powder, carbon black, carbon nanotube, metal powder and polyphenylene sulfide. Said fillers can be used separately or in combination, and the best filler is fused silicon dioxide or titania. For convenience of the entry of the fillers into the pores of ePTFE film, the fillers have a particle size of up to 100 μm and a median value of the particle size of from 0.01 to 15 μm, preferably from 0.5 to 10 μm. In order to achieve a better performance, the surface of the powdery filler may be processed by, e.g. a coupling agent. There further comprises (4) an auxiliary agent, comprising an emulsifying agent and a dispersant.

The process for making a high-frequency circuit baseboard by using said composite material comprises step 1: weighing the components of the composite material comprising (1) a dispersed emulsion of fluoropolymer with a low dielectric loss; (2) a porous, expanded polytetrafluoroethylene film; and (3) a powdery filler;

step 2: diluting the dispersed emulsion of fluoropolymer with a low dielectric loss with water to a suitable viscosity, adjusting the pH to 8-12 with ammonia water, mixing the powdery filler with the auxiliary agent, adding to the dispersed emulsion adjusted above, stirring and mixing to homogeneously disperse the powdery filler therein to obtain a liquid cement;

step 3: impregnating the porous, expanded polytetrafluoroethylene film with said liquid cement, controlling to a suitable thickness, baking at a temperature of 80-300° C. to remove water and the auxiliary agent to form a prepreg. The liquid cement forms a fluoropolymer resin layer on the surface of the porous, expanded polytetrafluoroethylene film, and the thickness of the prepreg is determined by the porous ePTFE film and the thickness of the fluoropolymer resin layer on the porous ePTFE film. In order to obtain prepregs having different thicknesses, the porous ePTFE film having different thicknesses may be used. After impregnating the liquid cement formed from said dispersed emulsion of said fluoropolymer and filling the pores of the ePTFE film, the thickness of the resin layer of the ePTFE film is controlled below 20 microns, preferably below 10 microns, so as to prepare thicker (higher than 250 microns) prepregs and to avoid the cracks on the fluoropolymer resin layer impregnated on the porous ePTFE film.

The thickness of the fluoropolymer resin layer on the porous ePTFE film is controlled by the solid contents of the dispersed emulsion of the fluoropolymer and the filler. The resin mixture (i.e. liquid cement) has a solid content which is regulated between 30 and 80%, preferably from 35 to 50%.

The impregnating operation may be conducted by the general impregnation-gluing machine for producing copper-clad plate, wherein the temperature of the oven of the gluing machine may be set up in segments and ranges from 80 to 300° C. to remove water, emulsifying agent, dispersant and the like.

Step 4: laminating said several sheets of prepreg, pressing a metal foil over each of the two sides thereof, hot-pressing in a hot press at a temperature of 350-400° C. and a pressure of 25-100 Kg/cm$^2$ to obtain a high-frequency circuit baseboard. Said metal foils are copper, brass, aluminium, nickel or alloy or composite metal foils of these metals.

High-frequency circuit baseboard prepared thereby comprises several laminated sheets of prepreg made from the composite material, and metal foils pressed over the two sides thereof.

The following examples further disclose and describe the dielectric properties of the high-frequency circuit baseboard prepared thereby, i.e. dielectric constant, dielectric loss angle tangent, high-frequency properties and heat resistance.

Example 1

The emulsion of polytetrafluoroethylene having a solid content of 60% was regulated to a viscosity of 20 mPa·s (20° C.) with deionized water, then to a pH value of 11 with ammonia water, stirred and mixed homogeneously.

The ePTFE film having a thickness of 40 microns and a porosity of 92% was impregnated with said emulsion of polytetrafluoroethylene, then baked in an oven at a temperature of 280° C. to remove water and the auxiliary agent (emulsifying agent, dispersant) and to produce a prepreg having a thickness of 51 microns and having no cracks.

5 sheets of prepregs above were laminated and pressed with a copper foil on each of the two sides thereof, then thermally pressed in a press at a temperature of 350-400° C. and a pressure of 70 Kg/cm$^2$ to produce said high-frequency circuit baseboard. Upon test, the produced high-frequency circuit baseboard had a dielectric constant of 2.08 (10 GHZ) and a dielectric loss angle tangent of 0.0002 (10 GHZ).

Example 2

The emulsion of polytetrafluoroethylene having a solid content of 60% was regulated to a viscosity of 15 mPa·s (20° C.) with deionized water, then to a pH value of 11 with ammonia water, stirred and mixed homogeneously. A fused silicon dioxide powder (the weight ratio of silicon micropowder to PTFE being 1:1) was added to said emulsion, stirred to homogeneously disperse silicon dioxide in the emulsion to produce a liquid cement which may be impregnated.

The ePTFE film having a thickness of 300 microns and a porosity of 95% was impregnated with said regulated liquid cement, then baked in an oven at a temperature of 280° C. to remove water and the auxiliary agent (emulsifying agent, dispersant) and to produce a prepreg having a thickness of 308 microns and having no cracks.

1 sheet of prepreg above was laminated and pressed with a copper foil on each of the two sides thereof, then thermally pressed in a press at a temperature of 380° C. and a pressure of 70 Kg/cm$^2$ to produce said high-frequency circuit baseboard. Upon test, the produced high-frequency circuit baseboard had a dielectric constant of 2.53 (10 GHZ) and a dielectric loss angle tangent of 0.0003 (10 GHZ).

Example 3

The emulsion of polytetrafluoroethylene having a solid content of 60% was regulated to a viscosity of 15 mPa·s (20° C.) with deionized water, then to a pH value of 11 with ammonia water, stirred and mixed homogeneously. A fused silicon dioxide powder (the weight ratio of silicon micropowder to PTFE being 1:1) was added to said emulsion, stirred to homogeneously disperse silicon dioxide in the emulsion to produce a liquid cement which may be impregnated.

The ePTFE film having a thickness of 120 microns and a porosity of 95% and filled with fused silicon dioxide fillers (having a content of 50% in the film) was impregnated with said regulated liquid cement, then baked in an oven at a temperature of 280° C. to remove water and the auxiliary agent (emulsifying agent, dispersant) and to produce a prepreg having a thickness of 128 microns and having no cracks.

1 sheet of prepreg above was laminated and pressed with a copper foil on each of the two sides thereof, then thermally pressed in a press at a temperature of 380° C. and a pressure of 100 Kg/cm$^2$ to produce said high-frequency circuit baseboard. Upon test, the produced high-frequency circuit baseboard had a dielectric constant of 2.65 (10 GHZ) and a dielectric loss angle tangent of 0.0003 (10 GHZ).

Comparison Example 1

Biphenol-A epoxy resin (epoxy resin A) and brominated epoxy resin (epoxy resin B) were dissolved in dimethylformamide. Dicyandiamide relative to 0.7 equivalent mole ratio of amine and a suitable amount of 2-MI (2-methylimidazole) were used as the promoters and mixed at room temperature to obtain a liquid cement.

The ePTFE film having a thickness of 40 microns and a porosity of 92% was impregnated with said liquid cement, then baked in an oven at a temperature of 155° C. to remove the solvent dimethylformamide and to produce a prepreg having a thickness of 54 microns.

5 sheets of prepreg above was laminated and pressed with a copper foil on each of the two sides thereof, then thermally pressed in a press at a curing temperature of 177° C. and a curing pressure of 50 Kg/cm$^2$ for a curing time of period of 90 minutes. Upon test, the produced high-frequency circuit baseboard had a dielectric constant of 3.54 (10 GHZ) and a dielectric loss angle tangent of 0.008 (10 GHZ).

Comparison Example 2

Polyimide resin synthesized by dianhydride and diamine was dissolved in dimethylformamide; and a suitable amount of triphenylphosphine was used as the curing promoter to obtain a liquid cement.

The ePTFE film having a thickness of 40 microns and a porosity of 92% was impregnated with said liquid cement, then baked in an oven at a temperature of 155° C. to remove the solvent dimethylformamide and to produce a prepreg having a thickness of 50 microns.

5 sheets of prepreg above was laminated and pressed with a copper foil on each of the two sides thereof, then thermally pressed in a press at a curing temperature of 260° C. and a curing pressure of 50 Kg/cm² for a curing time of period of 120 minutes. Upon test, the produced high-frequency circuit baseboard had a dielectric constant of 3.32 (10 GHZ) and a dielectric loss angle tangent of 0.006 (10 GHZ).

In said examples and comparison examples, copper clad plates were tested by reference to the IPC4101 standard; the dielectric properties were tested by the SPDR (splite post dielectric resonator) method, wherein the testing condition was the A state, 10 GHz.

According to Examples 1, 2 and 3 above, it can be seen that the thickness of the produced prepreg can be regulated and have no cracks; and the produced high-frequency circuit baseboard has a low dielectric constant and dielectric loss angle and better high-frequency properties. In addition, since no woven fibers are used as the reinforcing materials, the baseboard has a good inside uniformity, and has no difference in the dielectric constant in X/Y direction. According to the comparison examples above, it can be seen that, since the thermosetting resins having a great dielectric loss angle tangent and the porous ePTFE film are used in combination, the produced circuit baseboard has a far greater dielectric loss angle tangent than the dielectric constant of the circuit baseboard using thermoplastic fluoropolymer resin and the porous ePTFE film in combination. Thus the circuit baseboard using thermoplastic fluoropolymer resin and the porous ePTFE film in combination has more excellent high-frequency properties and a better effect on the high-frequency signal transmission.

As stated above, the circuit baseboard of the present invention has more excellent dielectric properties as compared to general copper foil baseboard, i.e. lower dielectric constant and dielectric loss angle tangent and better high-frequency properties.

The aforesaid examples are not used to limit the content of the composition of the present invention. Any minute amendment, equivalent change and modification to the examples above according to the technical essence or the weight part or content of the composition of the present invention falls within the scope of the technical solution of the present invention.

The invention claimed is:

1. A prepreg produced by a method, the method comprising the steps of:
   Step 1) preparing a liquid cement consisting of a mixture of:
   a) an emulsion of polytetrafluoroethylene in water,
   b) a powdery filler, and
   c) an auxiliary agent;
   Step 2) forming a composite consisting of the liquid cement and a porous, expanded polytetrafluoroethylene (ePTFE film);
   wherein the liquid cement is coated onto a surface of and infused into the pores of the porous, ePTFE film; and
   wherein the liquid cement coated onto the surface of the porous ePTFE film has a thickness that is controlled below 20 microns; and
   Step 3) baking the composite at 80-300° C. to remove water and the auxiliary agent from the composite to form the prepreg.

2. The composite material according to claim 1, wherein the porous, expanded polytetrafluoroethylene film is made from polytetrafluoroethylene resin without or with ceramic fillers.

3. The composite material according to claim 1, wherein the porous, expanded polytetrafluoroethylene film is made by the expansion-stretching method, and has a pore size of from 1 to 100 µm and a porosity of 30-98%.

4. The composite material according to claim 1, wherein the powdery filler has a particle size of up to 100 µm and a median value of the particle size of from 0.01 to 15 µm.

5. The composite material according to claim 1, wherein the powdery filler is one or more selected from the group consisting of crystalline silicon dioxide, fused silicon dioxide, spherical silicon dioxide, alumina, strontium titanate, barium titanate, barium strontium titanate, boron nitride, aluminum nitride, silicon nitride, titania, glass powder, glass chopped fiber, talc, mica powder, carbon black, carbon nanotube, metal powder and polyphenylene sulfide.

6. The composite material according to claim 1, wherein the auxiliary agent comprises an emulsifying agent and a dispersant.

7. A high-frequency circuit baseboard made from the composite material according to claim 1, comprising several laminated sheets of prepreg made from the composite material, and metal foils pressed over the two sides thereof.

8. The composite material according to claim 4, wherein the powdery filler is one or more selected from the group consisting of crystalline silicon dioxide, fused silicon dioxide, spherical silicon dioxide, alumina, strontium titanate, barium titanate, barium strontium titanate, boron nitride, aluminum nitride, silicon nitride, titania, glass powder, glass chopped fiber, talc, mica powder, carbon black, carbon nanotube, metal powder and polyphenylene sulfide.

* * * * *